United States Patent
Jones et al.

(10) Patent No.: US 10,607,126 B2
(45) Date of Patent: Mar. 31, 2020

(54) ASSET TRACKER UTILIZING THREAD PROTECTOR

(71) Applicant: SANVEAN TECHNOLOGIES LLC, Katy, TX (US)

(72) Inventors: Stephen Jones, Cypress, TX (US); Junichi Sugiura, Bristol (GB)

(73) Assignee: SANVEAN TECHNOLOGIES LLC, Katy, TX (US)

(*) Notice: Subject to any disclaimer, the term of this patent is extended or adjusted under 35 U.S.C. 154(b) by 0 days.

(21) Appl. No.: 16/162,104

(22) Filed: Oct. 16, 2018

(65) Prior Publication Data
US 2020/0019829 A1 Jan. 16, 2020

Related U.S. Application Data

(60) Provisional application No. 62/696,210, filed on Jul. 10, 2018.

(51) Int. Cl.
| | |
|---|---|
| *G06K 19/07* | (2006.01) |
| *H01L 43/08* | (2006.01) |
| *G01S 5/02* | (2010.01) |
| *E21B 47/12* | (2012.01) |
| *G01S 5/00* | (2006.01) |
| *E21B 12/02* | (2006.01) |

(52) U.S. Cl.
CPC .......... *G06K 19/0717* (2013.01); *E21B 12/02* (2013.01); *E21B 47/122* (2013.01); *G01S 5/0036* (2013.01); *G01S 5/0257* (2013.01); *H01L 43/08* (2013.01)

(58) Field of Classification Search
CPC .................................. G06K 19/0717
USPC .......................... 235/449, 439, 492
See application file for complete search history.

(56) References Cited

U.S. PATENT DOCUMENTS

| | | | |
|---|---|---|---|
| 2012/0126008 A1* | 5/2012 | Binmore | G06K 19/0723 235/439 |
| 2012/0305231 A1* | 12/2012 | Liang | A61F 7/0241 165/287 |
| 2018/0066513 A1 | 3/2018 | Sugiura et al. | |
| 2018/0128640 A1* | 5/2018 | Gonzalez Mendez | B60W 50/04 |
| 2018/0338003 A1* | 11/2018 | Carlson | H04W 4/70 |
| 2019/0063192 A1* | 2/2019 | Lhommet | E21B 41/0092 |
| 2019/0095933 A1* | 3/2019 | Doherty | G06Q 30/0201 |
| 2019/0106981 A1* | 4/2019 | Hailey | E21B 47/01 |
| 2019/0122036 A1* | 4/2019 | Ward | G06K 9/00342 |

(Continued)

*Primary Examiner* — Allyson N Trail
(74) *Attorney, Agent, or Firm* — Adolph Locklar

(57) ABSTRACT

A method for monitoring a piece of equipment during transport comprises a) applying a reporting device to the equipment, b) transporting the piece of equipment, c) transmitting sensed or location data using the transmitter, d) storing sensed or location in a memory device, e) retrieving the stored data from the memory device and d) using the retrieved data to assess the usability of the piece of equipment for an intended purpose. The reporting device may comprise a body adapted to mechanically couple to the end of the piece of equipment and a sensor package. The sensor package may comprise at least one dynamic sensor, the sensor generating sensed data corresponding to a sensed value, a satellite sensor generating location data, an optional ID reader, a cellular network transmitter, and a memory device adapted to receive, store, and report the sensed or location data.

20 Claims, 2 Drawing Sheets

(56) References Cited

U.S. PATENT DOCUMENTS

| | | | |
|---|---|---|---|
| 2019/0126456 A1* | 5/2019 | Abbott | B25F 5/001 |
| 2019/0170898 A1* | 6/2019 | Contreras Otalvora | E21B 41/00 |
| 2019/0240559 A1* | 8/2019 | Lewis | A63B 71/0622 |

* cited by examiner

ASSET TRACKER UTILIZING THREAD PROTECTOR

CROSS REFERENCE TO RELATED APPLICATIONS

This application is a non-provisional application which claims priority from U.S. provisional application No. 62/696,210, filed Jul. 10, 2018, which is incorporated by reference herein in its entirety.

TECHNICAL FIELD/FIELD OF THE DISCLOSURE

The present disclosure relates generally to tracking surface location of downhole drilling equipment, and specifically to a device for recording and transmitting real-time and historical data to identify equipment location for asset utilization purposes. More specifically, present disclosure relates a method and apparatus for determining the current and past locations of certain equipment.

BACKGROUND OF THE DISCLOSURE

Hydrocarbon production drilling typically requires the use of various types of tubular goods (pipe) and downhole tools that can be connected to the tubular goods. For example, drilling entails rotating a drill bit positioned at the end of a drill string that is comprised of several lengths of drill pipe that have been threaded together. The drill string may include drilling tools that are provided on a rental basis and charged for on a daily or hourly rate. Rental tools include downhole motors, axial oscillation tools, stick-slip mitigation tools, vertical drilling tools, rotary steerable systems (RSS), measurement-while-drilling (MWD) tools and the like each have application in various drilling contexts. The tubulars and tools are typically connected at threaded connections.

Because of the extreme and/or harsh conditions that may exist downhole and the risks associated with a tubing failure, both the pipe, the tool(s), and the threads used to connect them have significant value. As a result, end-caps may be used to protect the various pieces of drilling equipment during transportation and/or storage and to provide information about equipment location and when the equipment is used. In some instances, the end cap may be a thread protector.

Even with thread protectors in place, equipment may become damaged during shipping and/or handling. For example, if a pipe contacts another object with sufficient force, the pipe may deform, crack, or both. Even shock-sensitive electronics in a tubular tool may get damaged. Such damage may render the pipe unsuitable for its intended application. Mechanical damage can include dents, bends, bevel nicks, or coating damage. Pipes that are not lashed properly in place, or are lashed too tightly, can bend during shipping. Damage may also include notching or bruising of the pipe. Notches may occur when, for example, a pipe edge or the like gauges a piece out of an adjacent pipe. Bruising may be caused either by stacking too much weight on a pipe, causing a flat spot, or by a pipe colliding with other pipes. Either of these can compromise a pipe and make it unusable. Corrosion can also damage equipment. Corrosion during shipping can be caused by moisture or by exposure to corrosive chemicals. For example, humidity mixed with train or truck exhaust can create a potent acid that can cause pitting or small craters to form as this acid sits on or inside equipment. This can also occur if water in or on the equipment mixes with coal dust or salts during transport. Because any of these occurrences may affect the operable life of the equipment, it may be useful to have information about the environmental and mechanical history of each piece of equipment.

In addition, when several pieces of equipment are shipped, it may be desirable to keep track of where each piece is located and when and for how long it is used. Embedded compact drilling dynamics sensors can be used in conjunction with thread protector tracking device. When the thread protector tracking device is removed and the equipment is used in a borehole, the embedded compact drilling dynamics sensor will track downhole hours and conditions providing complete coverage of tool usage above ground and sub-surface (downhole). An example of a drilling dynamics sensor can be found in US2018/0066513.

SUMMARY

According to some embodiments, a method for monitoring a piece of equipment during transport may comprise a) applying to the piece of equipment a reporting device comprising, a body adapted to mechanically couple to the end of the piece of equipment and a sensor package affixed to the body and comprising: at least one dynamic sensor that generates sensed data corresponding to a sensed value, a satellite sensor generating location data, an optional ID reader, a wireless transmitter, and a memory device adapted to receive, store, and report the sensed data; b) transporting the piece of equipment; c) using the sensor package to generate at least one of sensed data and location data; d) transmitting the at least one of sensed data and location data using the transmitter; e) using the transmitted data to assess the usability of the piece of equipment for an intended purpose.

The wireless transmitter may be selected from the group consisting of cellular network transmitters, WIFI transmitters, Bluetooth transmitters and satellite transmitters. The sensor package may include a removal sensor to detect removal of the body from the piece of equipment and the removal sensor may be a magnetic field sensor. The optional ID reader may be selected from the group consisting of magnetic signature ID readers and RFID readers. The dynamic sensor may be selected from the group consisting of contact switches, non-contact switches, magnetic-field sensors, gyros, and accelerometers. The sensed data may include at least one measurement selected from the group consisting of shock, vibration, temperature, humidity, pressure, and strain.

The method may further include, after step b) the steps of: removing the reporting device from the piece of equipment; and using the wireless transmitter to report the time and GPS location of the removal of the reporting device from the piece of equipment. The method may further include the steps of: storing at least one of sensed data and location data in the memory device; and retrieving the stored data from the memory device. Step c) may occur during or after step b). The method may be used in conjunction with a piece of equipment that includes a compact drilling dynamics sensor embedded therein. In such embodiments, the method may further include the steps of removing the reporting device from the piece of equipment, using the piece of equipment in a borehole, using the compact drilling dynamics sensor to track at least one of downhole hours and downhole conditions, and including tracked downhole data in the data transmitted in step d) and received in step e).

In some embodiments, the asset tracker may include a wireless receiver and an operating program that includes at least one of a battery saving scheme, a logging scheme, or a transmission scheme, and the method may further include the steps of: sending the asset tracker a command via satellite or cellular network; receiving the command at the wireless receiver; and changing the operating program in response to the command.

The method may likewise further include a step of using the sensed data to determine at least one of product performance, inventory, and usage for the piece of equipment and/or a step of using the reported data to track the usage of rental tools and to optimize their utilization.

In some embodiments, an apparatus for monitoring a piece of equipment during transport may comprise a body adapted to mechanically couple to the end of the piece of equipment; and a sensor package affixed to the body. The sensor package may comprise at least one dynamic sensor, that is adapted to generate sensed data corresponding to a sensed value, a satellite sensor adapted to generate location data, an optional ID reader, a wireless transmitter, and a memory device adapted to receive, store, and report the sensed data. The wireless transmitter may be selected from the group consisting of cellular network transmitters, WIFI transmitters, Bluetooth transmitters and satellite transmitters. The sensor package may further include a removal sensor to detect removal of the body from the piece of equipment. The removal sensor may be a magnetic field sensor. The optional ID reader may be selected from the group consisting of magnetic signature ID readers and RFID readers. The dynamic sensor may be selected from the group consisting of contact switches, non-contact switches, magnetic-field sensors, gyros, and accelerometers.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
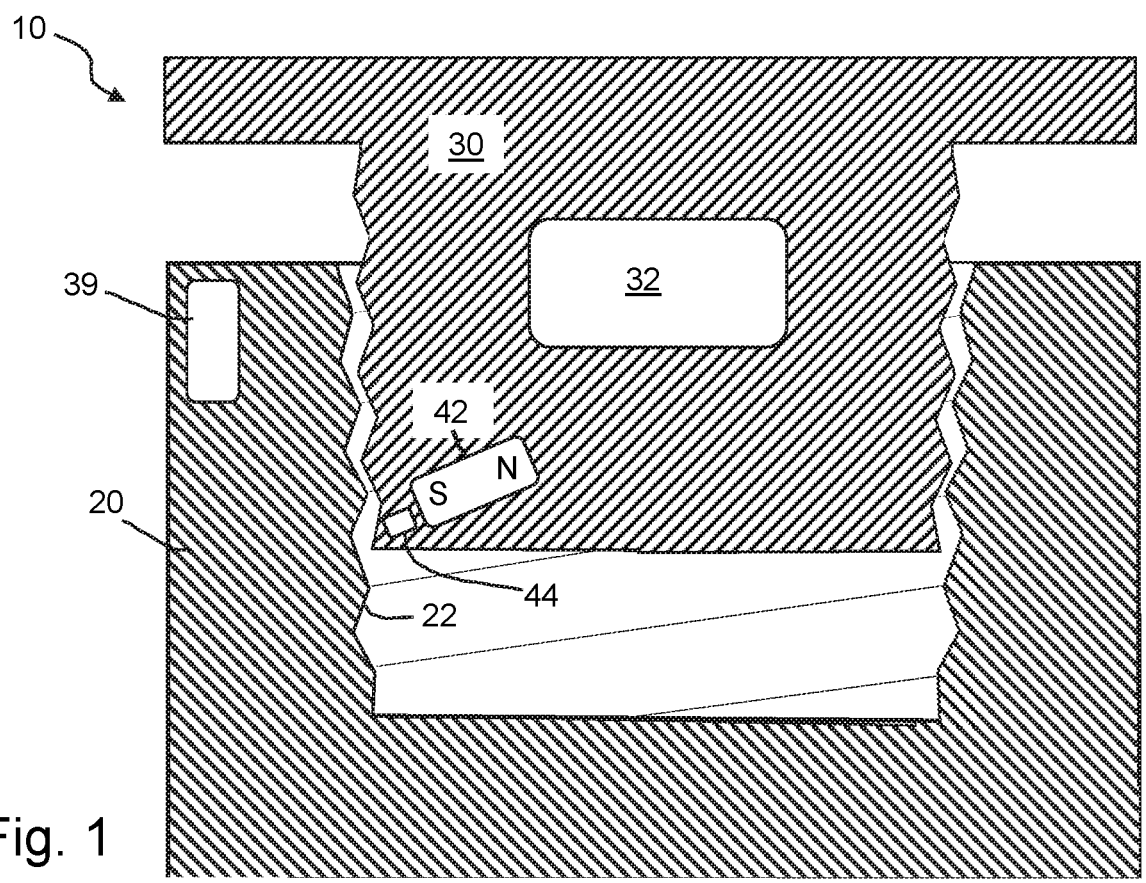
FIG. 1 is a schematic cross-section of an asset tracker in accordance with some embodiments of the present disclosure adjacent to a threaded asset.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring initially to FIG. 1, an asset tracker 10 in accordance with some embodiments is shown near one end of a downhole device 20. Downhole device 20, sometimes referred to herein as an "asset," can be a tubular or a more complex tool designed to connect to a tubular, such as a rotary steerable system (RSS), axial oscillation tool, stick-slip mitigation tool, steerable motor, wired motor, or the like. In FIG. 1, the box, or female, end of the tubular device is shown but it will be understood that the concepts disclosed herein can be also used in conjunction with a pin, or male, end. The asset tracker can also be installed into a lift sub; lift subs are frequently installed on certain tools when they are shipped to the field, such as drilling motors and rotary steerable tools.

Asset tracker 10 is adapted to mechanically engage the end of the asset, device 20. If, as shown at 22, tubular device includes threads, asset tracker 10 may include corresponding threads that allow asset tracker 10 to be threaded into engagement with device 20. In other embodiments, asset tracker may be constructed so as to elastically engage, e.g. snap into, the end of device 20. In any event, the coupling between asset tracker 10 and device 20 is sufficient to prevent asset tracker 10 from being unintentionally dislodged during transport and handling of the device 20.

Regardless of the mode of engagement and whether asset tracker 10 engages a pin or box, in some embodiments, asset tracker 10 includes a body 30 having a sensor package 32 affixed thereto or embedded therein. In some embodiments, sensor package 32 is molded into asset tracker 10. In some embodiments, sensor package 32 received in a chamber or recess in the body 30 and is accessible so that it can be placed/replaced quickly. In other embodiments, alternatively, sensor package 32 may be sealed inside the asset protector so as to prevent tampering therewith and/or the ingress of water.

Figure 2:
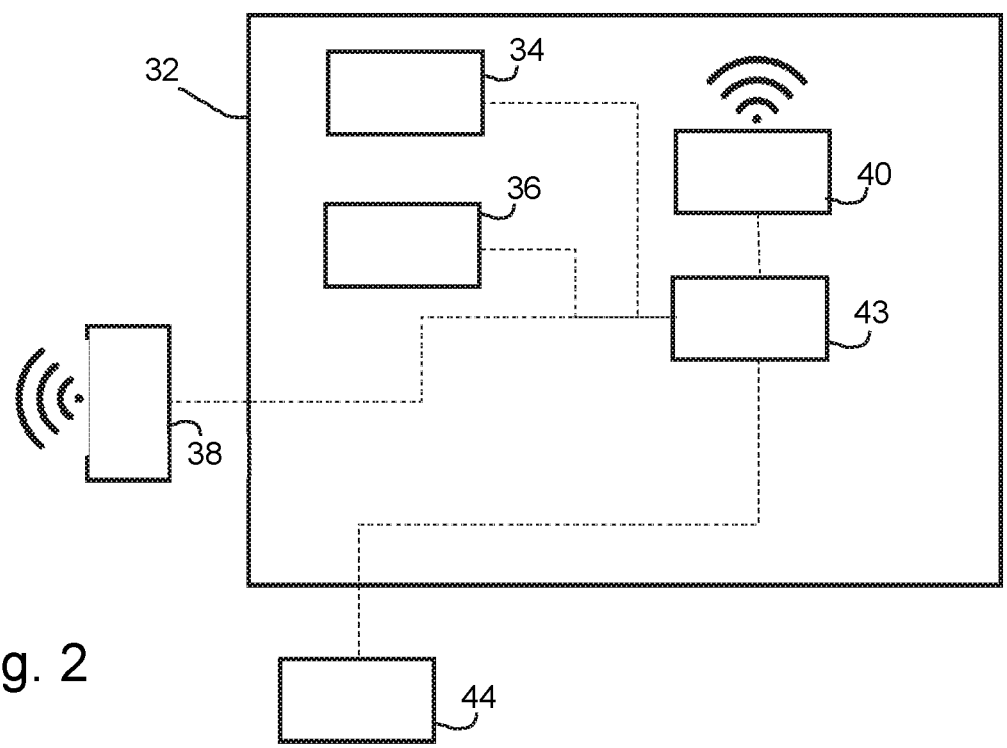
FIG. 2 is a schematic diagram of a sensor package in accordance with some embodiments of the present disclosure.

Referring to FIG. 2, in some embodiments, sensor package 32 may include one or more of a dynamic sensor(s) 34, a satellite/GPS sensor 36, an RFID reader 38, a cellular network transmitter 40, a and a memory device 43. Dynamic sensor(s) 34 in turn may include one or more of contact switches, non-contact switches, magnetic field sensors, inclination sensors, accelerometers, and one or more environmental sensors including but not limited to temperature sensors, pressure sensors, humidity sensors, and pH sensors.

In some embodiments dynamic sensors 34 may include a removal sensor adapted to sense when asset tracker 10 is affixed to or removed from a device 20. The following description relates to removal of asset tracker 10 from a device 20, but it will be understood that the same principles apply to affixation of asset tracker 10 to a device 20.

When asset tracker is removed, for example, from the end of a tubular device, one or more physical contact switches and/or non-contact switches may be positioned and configured to detect removal. Non-contact sensors may comprise magnetic field sensors (e.g. Hall-effect sensors, magneto-resistive sensors, MEMS magnetic sensors, and other solid-state magnetic-field sensors), which are reliable and durable. By way of example, in instances where the asset, device 20, comprises a ferromagnetic material such as steel or ferritic stainless steel, body 30 of asset tracker 10 may include a magnet 42 and a magnetic field sensor 44 such as a digital or analog Hall-effect sensor. When magnetic field sensor 44 is placed between magnet 42 and the ferromagnetic material, the magnetic field is concentrated and the sensor output may be ON (high voltage). When asset protector 10 is removed from asset 20, the sensor is no longer positioned between a magnet and a steel so it will sense a weaker magnetic field and the sensor output may be OFF (low voltage). Alternatively, multiple magnetic field sensors may be used to detect distortion of the earth's magnetic field by the portion of the asset; therefore, to detect attachment and detachment. Alternatively, the portion of the asset that is adjacent to the asset protector can be intentionally magnetized so that a magnetic-field sensor can detect the presence or absence of the magnetized asset. Other types of dynamic sensors 34 can be used to output whether the asset protector is affixed to the asset.

The output of the dynamic sensor will be binary, e.g. on/off, high/low, and will require very low current/low power to operate. When the removal is detected, the event may be recorded in memory and a special satellite signal containing that information can be sent if desired. In some embodiments, the satellite signal may have two bytes (16 bits), e.g. 1 bit to indicate removal and 15 bits to indicate the ID number of the affected asset as determined by RFID reader 38.

In alternative embodiments, dynamic sensors 34 may include one or more inclination sensors and removal of asset tracker 10 may be detected by detecting a change in inclination. In normal operations, downhole tools are typically stored in a substantially horizontal position until being prepared for use. Thus, when the inclination of asset tracker 10 changes by at least about 60 or at least about 70 degrees, it can be presumed that asset tracker 10 either has been removed or is about to be removed from device 20. Thus, inclination may be used to detect attachment or removal of the thread protector. The following shows an example inclination threshold where the tubular tool is typically transported in a horizontal position (90 degrees): ON (inclinations between 60 and 120 degrees or +/−30 degrees), and OFF (any other angles, e.g. less than or equal to 60 degrees and more than or equal to 120 degrees). The range of +/−30 degrees is given as an example and substantially any other ranges may be used, such as +/−25 degrees and +/−20 degrees. Any known inclination calculation equations known in the art could be used, such as three-axis inclination or one-axis (axial) inclination. Multiple accelerometers may be used for redundancy. These accelerometers may be optionally calibrated for accurate inclination measurement.

In some embodiments, one or more strain gauges could be connected to the asset tracker 10 and/or to asset 20.

Still referring to FIG. 2, satellite/GPS sensor 36 may be adapted to determine the location of asset tracker 10, using standard global positioning technology. This allows a user to know where each asset is, whether it is in transit, etc.

Figure 3:
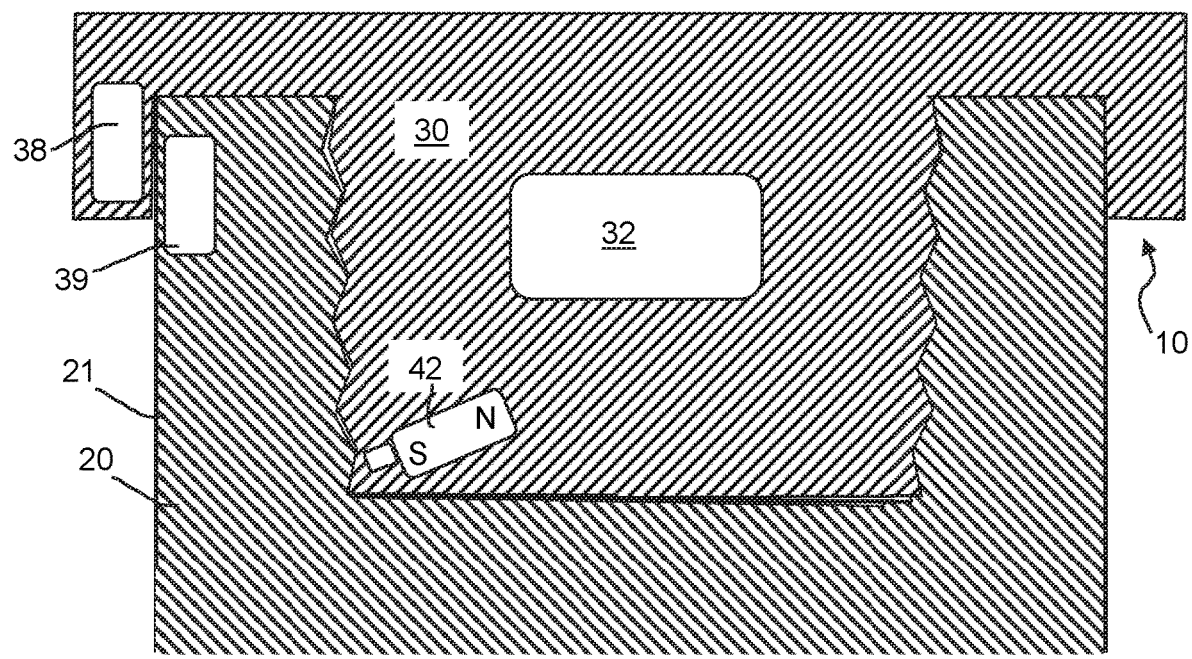
FIG. 3 is a schematic cross-section of an asset tracker in accordance with a further embodiment of the present disclosure affixed to a threaded asset.

Referring briefly to FIG. 3, asset tracker 10 may be configured to contact the outer surface 21 of asset 20 and RFID reader 38 may be adapted to read a nearby radio-frequency identifying tag or label 39 that may be attached to device 20 using standard RFID technology. If identifying information is available, other measurements made by asset tracker 10 can be associated with the specific asset 20 to which asset tracker 10 is attached. In some embodiments, asset-specific information can be recorded, monitored over time, and used for various analytical and tracking purposes. Similarly, if each asset includes an RFID tag, an asset tracker 10 that has been removed and then replaced in an asset can read the tag to determine whether the asset tracker has been replaced into the same asset from which it was removed. Alternatively, unique magnetic markers (such as multiple magnets with varying polarities) may be placed in the asset. Magnetic-field sensors (Hall-effect sensors, magneto-resistive sensors, pick-up coils, MEMS magnetometers, etc.) may be used to read unique magnetic signatures (ID) consisting of magnetic markers. Multiple solid-state magnetometers may be used to detect unique magnetic signatures. Alternatively, a unique optical identification (e.g. barcode ID, etc.) may be placed in the asset. An optical ID reader (e.g. ID reader) may be used to read unique optical ID placed on the asset.

Cell network transmitter 40 may be adapted to communicate data gathered by asset tracker 10 to a desired location using standard cellular communications technology. Transmitter 40 is adapted to receive data from one or more of the sensors in sensor package 32 and to transmit it using standard transmission protocols. Transmitter 40 can be configured to transmit data continuously, intermittently, or only when certain criteria are met. By way of example, transmitter 40 may be configured to transmit only when asset tracker 10 is removed (or affixed), or when a certain measurement exceeds a threshold value. The use of the cell network transmitter is optional. In some embodiments, the satellite transmitter is used. The satellite transmitter signal may have two bytes (16 bits), e.g. 1 bit to indicate removal and 15 bits to indicate the ID number of the affected asset. Alternatively, other types of wireless transmitters may be used, such as a WIFI transmitter or a Bluetooth transmitter.

In addition to the foregoing, asset tracker 10 may include sensor to measure one or more of humidity, pH, pressure, and temperature. Such measurements may be made, e.g., intermittently during transport and handling of the asset, or may be made upon occurrence of a triggering event such as removal of the asset tracker from the asset. Such sensors may be used to detect and record anomalous transportation conditions. By way of example only, anomalous transportation conditions may trigger the cellular network transmitter 40 to send a signal indicating, e.g., that the temperature during transportation is too high. Such real-time information (satellite info) will enhance understanding of asset usage in real time.

Likewise, asset tracker 10 may measure and record and/or report other anomalous conditions during transportation. Such anomalous conditions may include, for example, high shock or impact and/or extended or extreme vibration, such as may occur if the asset is dropped. Thus, asset tracker 10 may generate data about mechanical impacts or vibrations that occur during transportation and may transmit that data (e.g. maximum shock levels with asset/tracker ID number, location and timestamp) to an operator for use in assessing the usability of the asset.

Asset tracker 10 can be configured to transmit its location with fixed intervals, such as every 12 hours, every 6 hours, every 3 hours, and so on. Alternatively or in addition, the asset tracker may transmit the information when anomalous conditions are detected during transportation. For example, asset tracker 10 may be configured to transmit a signal when a sensed value exceeds a threshold level. In some embodiments, the reporting scheme (fixed intervals or event-driven reporting) may be remotely programmed using a satellite signal receiver and changed on the fly. In these cases, asset tracker 10 may also include a wireless receiver and may, for example, run an operating program that includes at least one of a battery-saving scheme, a data-logging scheme, or a transmission scheme. For example, the asset tracker arrives at a destination (e.g. at a rig) and is waiting to be picked up, a battery-saving scheme may be changed to lower the power consumption (e.g. sleep mode) until a "wake-up" event occurs (e.g. motion sensing, inclination change, etc.). A similar battery-saving scheme can be applied when the asset tracker is in a base location and when the tracker is not in use or the attached asset is stationary for substantially a long period of time (e.g. in a temporary storage for a week) Similarly, a data-logging scheme (e.g. continuous logging, event-driven logging, or no logging) may be changed on the fly using a satellite signal transmitted to the asset tracker. Alternatively or in addition, various threshold values, threshold ranges and other sensor triggering schemes may be changed via a satellite (e.g. changing inclination trigger ranges, motion/vibration trigger sensitivity thresholds/ ranges). If desired, a command may be sent to asset tracker 10 via satellite or cellular network, instructing the tracker to change the operating program in response to the command. The command may be received at the wireless receiver, and the operating program may be changed in response to the received command.

Information collected and reported by asset tracker 10 can be used as product performance data, warranty data, inventory data, and/or client-related data. By way of example only, the reported data can be used to track the usage of rental tools and to optimize their utilization.

In some embodiments, a rig location may be known. In those instances, location information sent by the asset tracker 10 can be used to determine whether the asset has arrived at the destination. The attachment and detachment of the asset tracker will provide information indicative of how long the tool is in use (downhole) in real-time.

In some instances, the equipment or asset, device 20, may include compact drilling dynamics sensors (not shown) that can provide information about downhole asset usage (hours and conditions). The sensors can be embedded in or otherwise supported on the asset and can be configured to provide information about downhole conditions and asset usage when the asset tracker is removed and the asset is used in a borehole. In some embodiments, information from compact drilling dynamics sensors (e.g. US2018/0066513) can be combined with information from asset tracker 10. Regular maintenance and preventative maintenance schedules can be based on the combined information. Some tools may be on location for a long time without being used. In some such instances, the sensor/electronics batteries can be monitored and if necessary, the asset may be sent back to the base for battery replacement.

The foregoing outlines features of several embodiments so that a person of ordinary skill in the art may better understand the aspects of the present disclosure. Such features may be replaced by any one of numerous equivalent alternatives, only some of which are disclosed herein. One of ordinary skill in the art should appreciate that they may readily use the present disclosure as a basis for designing or modifying other processes and structures for carrying out the same purposes and/or achieving the same advantages of the embodiments introduced herein. One of ordinary skill in the art should also realize that such equivalent constructions do not depart from the spirit and scope of the present disclosure and that they may make various changes, substitutions, and alterations herein without departing from the spirit and scope of the present disclosure.

What is claimed is:

1. A method for monitoring a piece of equipment during transport, wherein the piece of equipment has at least one threaded end, the method comprising:
  a) applying to the piece of equipment a reporting device comprising,
    a body adapted to mechanically couple to the end of the piece of equipment, wherein the body comprises an end cap configured to releasably engage and protect the threaded end of the piece of equipment; and
    a sensor package affixed to the body and comprising:
      at least one dynamic sensor, the sensor generating sensed data corresponding to a sensed value;
      a satellite sensor generating location data;
      a wireless transmitter; and
      a memory device adapted to receive, store, and report the sensed data;
  b) transporting the piece of equipment;
  c) using the sensor package to generate at least one of sensed data and location data;
  d) transmitting the at least one of sensed data and location data using the transmitter;
  e) receiving the transmitted data and using the transmitted data to assess the usability of the piece of equipment for an intended purpose;
  f) removing the reporting device from the piece of equipment; and
  g) using the piece of equipment in a borehole.

2. The method of claim 1 wherein the wireless transmitter is selected from the group consisting of cellular network transmitters, WIFI transmitters, Bluetooth transmitters and satellite transmitters.

3. The method of claim 1 wherein the sensor package includes a removal sensor to detect removal of the body from the piece of equipment.

4. The method of claim 3 wherein the removal sensor is a magnetic field sensor.

5. The method of claim 1 wherein the sensor package further includes an ID reader selected from the group consisting of magnetic signature ID readers, optical ID readers and RFID readers.

6. The method of claim 1, further including, after step f) the step of:
  using the wireless transmitter to report the time and GPS location of the removal of the reporting device from the piece of equipment.

7. The method of claim 1 wherein step c) occurs during and after step b).

8. The method of claim 1 wherein the piece of equipment includes a compact drilling dynamics sensor embedded therein, further including the steps of:
  using the compact drilling dynamics sensor to track at least one of downhole hours and downhole conditions; and
  including tracked downhole data in the data transmitted in step d) and received in step e).

9. The method of claim 1 wherein step c) includes generating data about mechanical impacts or vibrations that occurred during step b) and step d) includes transmitting data about mechanical impacts or vibrations that occurred during step b).

10. The method of claim 1 wherein the reporting device is an asset tracker and wherein the asset tracker includes a wireless receiver and an operating program that includes at least one of a battery saving scheme, a logging scheme, a sensor triggering scheme, or a transmission scheme, further including the steps of:
  sending the asset tracker a command via satellite or cellular network;
  receiving the command at the wireless receiver; and
  changing the operating program in response to the command.

11. The method of claim 1 wherein the sensed data includes at least one measurement selected from the group consisting of shock, vibration, temperature, humidity, pressure, and strain.

12. The method of claim 1 wherein the sensor is selected from the group consisting of contact switches, non-contact switches, magnetic-field sensors, gyros, and accelerometers.

13. The method of claim 1 further including the step of using the sensed data to determine at least one of product performance, inventory, and usage for the piece of equipment.

14. The method of claim 1 further including the step of using the reported data to track the usage of rental tools and to optimize their utilization.

15. An apparatus for monitoring a piece of equipment during transport, wherein the piece of equipment has at least one threaded end, comprising:
  a body adapted to mechanically couple to the end of the piece of equipment, wherein the body comprises an end cap configured to releasably engage and protect the threaded end of the piece of equipment; and
  a sensor package affixed to the body and comprising:
    at least one dynamic sensor, the sensor generating sensed data corresponding to a sensed value;
    a satellite sensor generating location data;
    a wireless transmitter; and
    a memory device adapted to receive, store, and report the sensed data.

16. The apparatus of claim 15 wherein the wireless transmitter is selected from the group consisting of cellular network transmitters, WIFI transmitters, Bluetooth transmitters and satellite transmitters.

17. The apparatus of claim 15 wherein the sensor package further includes a removal sensor to detect removal of the body from the piece of equipment.

18. The apparatus of claim 17 wherein the removal sensor is a magnetic field sensor.

19. The apparatus of claim 15 wherein the sensor package includes an ID reader selected from the group consisting of magnetic signature ID readers, optical ID readers and RFID readers.

20. The method of claim 1 wherein the dynamic sensor is selected from the group consisting of contact switches, non-contact switches, magnetic-field sensors, gyros, and accelerometers.

* * * * *